(12) United States Patent
Zhu et al.

(10) Patent No.: US 8,866,481 B2
(45) Date of Patent: Oct. 21, 2014

(54) STACKED COIL FOR MAGNETIC RESONANCE IMAGING

(75) Inventors: Haoqin Zhu, Winnipeg (CA); Grace Fengqi Wang, Winnipeg (CA)

(73) Assignee: Imris Inc., Winnipeg, MB (CA)

( * ) Notice: Subject to any disclaimer, the term of this patent is extended or adjusted under 35 U.S.C. 154(b) by 310 days.

(21) Appl. No.: 13/290,176

(22) Filed: Nov. 7, 2011

(65) Prior Publication Data

US 2013/0113485 A1   May 9, 2013

(51) Int. Cl.
  *G01V 3/00* (2006.01)
  *G01R 33/3415* (2006.01)
  *G01R 33/36* (2006.01)

(52) U.S. Cl.
  CPC .......... *G01R 33/3415* (2013.01); *G01R 33/365* (2013.01)
  USPC ........................................................ 324/318

(58) Field of Classification Search
  USPC ................................. 324/300–322
  See application file for complete search history.

(56) References Cited

U.S. PATENT DOCUMENTS

| | | | |
|---|---|---|---|
| 6,150,816 A * | 11/2000 | Srinivasan .................... | 324/318 |
| 6,900,637 B1 | 5/2005 | Seeber | |
| 6,906,518 B2 * | 6/2005 | Leussler ........................ | 324/318 |
| 7,282,915 B2 * | 10/2007 | Giaquinto et al. ............ | 324/318 |
| 7,514,926 B2 * | 4/2009 | Adriany et al. ............... | 324/318 |
| 7,911,209 B2 * | 3/2011 | Alradady et al. ............. | 324/318 |
| 7,999,548 B1 * | 8/2011 | Brown et al. .................. | 324/318 |
| 8,193,811 B2 * | 6/2012 | Tropp et al. ................... | 324/318 |
| 8,487,615 B2 * | 7/2013 | Zhu et al. ....................... | 324/307 |
| 8,581,588 B2 * | 11/2013 | Driesel et al. ................. | 324/322 |
| 2002/0169374 A1 | 11/2002 | Jevtic | |
| 2005/0073309 A1 | 4/2005 | Williams et al. | |
| 2007/0016003 A1 | 1/2007 | Piron et al. | |
| 2007/0085634 A1 | 4/2007 | Du et al. | |
| 2009/0076377 A1 | 3/2009 | Findekelee | |
| 2009/0096456 A1 | 4/2009 | Biber et al. | |

\* cited by examiner

*Primary Examiner* — Dixomara Vargas
(74) *Attorney, Agent, or Firm* — Adrian D. Battison; Ade & Company Inc.

(57) ABSTRACT

A receive coil for MRI includes a stacked pair of coil elements to communicate the respective MR signals therein to the signal processing system in separate channels. This greatly increases image SNR and penetration depth and in parallel imaging. The coils are arranged in a stacked relationship so as to be at least partly and preferably wholly overlapped and lying in the same or closely adjacent planes. The coils include tuning capacitors to a common resonant frequency. The coils are connected by a conductor arranged such that the signals of the first and second coils are decoupled. The conductor can form a common portion of the coils including a capacitance of in the common portion arranged. The coils can be connected by two conductors one of which is a short and the other contains a capacitor. In both cases the connection conductors provide the decoupling.

20 Claims, 10 Drawing Sheets

STACKED COIL FOR MAGNETIC RESONANCE IMAGING

This invention relates to Stacked Phase Array Coil for magnetic resonance imaging.

BACKGROUND OF THE INVENTION

As is well known, apparatus for MR imaging of a subject includes an MR magnet to generate a magnetic field to be applied to the subject, an RF transmit coil arrangement for generating an RF pulse in a transmit stage to be applied to the subject to be imaged such that the subject generates an MR signal in response to the magnetic field and the RF pulse applied, a receive coil arrangement for acquiring MR signals in a receive stage and a signal processing system. In recent years phased array surface coils have been used to feed separate signals to a plurality of separate channels for receiving the MR signals for carrying out signal processing in the separate channels by which an image is generated.

Fast MR image technology has been the development of sophisticated multi-element phased array coils which are capable of acquiring multiple channels of data in parallel. This 'parallel imaging' technique uses unique acquisition schemes that allow for accelerated imaging, by replacing some of the spatial coding originating from the magnetic gradients with the spatial sensitivity of the different coil elements. However, the increased acceleration also reduces the signal-to-noise ratio and can create residual artifacts in the image reconstruction. Many parallel acquisition and reconstruction schemes are known.

It is necessary that for phased array coils to operate, decoupling of the signals of the coils must be obtained so that they can be independently processed.

Typically decoupling is obtained by the well known arrangement in which the coils are partly overlapped by a ratio of overlapped to non-overlapped area which acts to decouple the two coils simply by the geometry without any pre-processing of the signals prior to processing in the separate channels of the processing system.

It is known that stacking of coils one on top of the other, or one inside of the other, will provide a very effective arrangement of the phased array coils since they can be of the same size and are located at the same position relative to the sample.

However it is accepted that such stacked coils provide a very strong mutual inductance which prevents decoupling of the signals.

In a paper entitled "Study on the Decoupling of Stacked Phased Array coils for magnetic resonance imaging" by Dandan Liang et al published in Progress in Electromagnetics Research Symposium Proceedings Suzhou China Sep. 12 to 16, 2011 there is described a pre-processing system which uses a complex algorithm to perform the post-processing for obtaining the decoupled signals of the stacked coils. Even using this complex algorithm, the coils must be spaced one from the other by a distance greater than 0.5 cms and typically as much as 3.0 cms. This of course significantly reduces the desirability of the stacked arrangement since it is highly desirable to have the coils substantially directly overlying or as close as possible to the same plane. The best advantage is obtained when the coils are in the same plane, or surface if they are not planar, and of the same shape in that plane. However the difficulty of decoupling is reduced when the coils are axially spaced. This paper does not provide actual imaging results, and since actual imaging is more complicated that bench top testing because both pre and post processing of the images is required. Artifacts will most likely result from the pre and post processing of the images.

Current phased array coil designs where the individual coil elements are arranged side by side with partial overlap involves a trade-off between the size of the coil elements and the number of individual elements for a certain overall size of the coil. As the ratio of overlapped portion to non-overlapped portion is set in order to provide the required decoupling, the number of coil elements which can be arranged in a required is dependent on the size of the coil elements.

Current design is also limited by the relationship between coil element size to the penetration achieved since axial penetration of the image is proportional to transverse dimension of the coil.

Current design is also limited by the relationship between coil element size and SNR values. Large size elements produce poor SNR values and small size elements produce good SNR values.

Current imaging design involves a trade-off between image penetration and SNR. In order to achieve good penetration, birdcage volume coils are used because of the uniformity of the RF field in the entire volume of the coil, but do not have good SNR values compared to phased array surface coils. Phased array surface coils have good SNR, but do not have good penetration compared to the birdcage volume coil. To achieve good penetration with the phased array coil, the size of each element has to be increased, but at a sacrifice of good SNR.

The higher the numbers of coil elements in the phase encode direction, the higher the acceleration achieved in parallel imaging.

Current imaging design involves a trade-off between in parallel imaging and SNR, the higher accelerate(R), the more SNR decreased and more image artifact generated.

$$SNR^{PMRI} = \frac{SNR^{full}}{g\sqrt{R}}$$

The stacked array coil can greatly improve the relationship between penetration and SNR and fast imaging.

SUMMARY OF THE INVENTION

It is one object of the invention to provide a stacked array coil which is advantageous in the relationship between penetration and SNR and fast imaging.

According to one aspect of the invention there is provided an apparatus for MR imaging of a subject comprising a MR magnet to generate a magnetic field to be applied to the subject;

an RF transmit coil arrangement for generating an RF pulse in a transmit stage to be applied to the subject to be imaged such that the subject generates an MR signal in response to the magnetic field and the RF pulse applied;

a receive coil arrangement for acquiring MR signals in a receive stage;

and a signal processing system having a plurality of separate channels for receiving the MR signals for carrying out signal processing in the separate channels by which an image is generated;

the receive coil arrangement comprising:

first and second coils arranged to be located adjacent the subject so as to receive the MR signal;

the first and second coils being arranged in a stacked relationship so as to be at least partly overlapped;

said at said first and second coils including tuning capacitors arranged to provide individually tuning of the first and second coils to a common resonant frequency for receiving said MR signal at said common frequency;

each of said first and second coils being arranged to communicate the respective MR signals therein to the signal processing system such that the respective signals are processed in separate channels of the signal processing system;

the first and second coils being connected by a conductor arranged such that the signals of the first and second coils are decoupled.

The first and second coils are arranged to communicate the respective MR signals therein to the signal processing system through either wired and wireless connection.

Each of said first and second coils act only in the receive stage and do not transmit the applied RF pulse in the transmit stage so that they contain therein an arrangement, such as a passive decoupling and active block circuit, to halt current flow therein at the resonant frequency during the transmit stage so as to prevent the presence of said all coil loops from interfering with the RF pulse during the transmit stage. This arrangement is described in more detail in the application mentioned immediately below.

This stacked element coil design can be used for both inductive wireless coil, as disclosed in application Ser. No. 13/090,816 filed Apr. 20, 2011, and can be used for traditional phased array coil designs with cables and preamplifiers.

While the invention is defined herein as using first and second coils in the stacked arrangement, additional coil elements greater than the two defined can be used in some cases. However of course this increases the complexity of the arrangements for decoupling and tuning each of the coil elements.

The conductor connected between the first and second coils is arranged to effect the decoupling by cancelling mutual inductance therebetween.

Preferably the first and second coils comprise surface coils. However designs can be provided for volume coils using the concepts described herein.

Preferably the first and second coils lie substantially in a common surface. In some cases the surface maybe planar, but in other cases is may be curved or shaped to follow the required shape of the subject, such as an arch over the upper body of the patient.

The intention is that the first and second coils are shaped to define substantially the same transverse dimensions for same depth penetration. However there may be a difference in shape which can be used to decrease capacitive connection between the coils, bearing in mind that the selection of spacing is a trade-off in regard to decoupling and capacitive coupling in relation to improved signal processing.

In a preferred arrangement, the first and second coils are arranged so that one lies inside the other as this allows them to lie in a common plane without increasing the capacitive coupling therebetween to a level which cannot be tolerated.

For the same reason, the first and second coils are preferably of different shape in plan so that the conductors thereof do not follow the same path.

In another preferred arrangement, the first and second coil elements are each formed by conductors which are formed of a wire as opposed to the conventional flat strip. That is the wire has substantially same height as width as opposed to the conventional flat strip which has very little height. This arrangement acts to reduce capacitive connection between the two coil elements in relation to two overlying strips so that the spacing between the two coils can be reduced, even to a situation where they are directly overlying.

The above arrangements allow the coil elements to lie in the same plane or in planes with sufficient isolation to prevent physical contact between the individual coil elements with almost no restriction of the axial spacing, as opposed to the arrangement of the above paper where decoupling can only be obtained by increased axial spacing. If the first coil element is contained entirely inside the second coil element, no axial separation is required.

In one arrangement, the conductor connecting the first and second coil elements provides a common portion of each of the first and second coil elements with a capacitor in the common portion which forms part of the tuning capacitors of each of the first and second coil elements.

The pair of coils can be used as a single pair where the two signals produced thereby are processed in two separate channels; but more preferably where the signal processing system has a much larger number of channels, a series of such pairs can be used where each pair provides two respective signals for a respective pair of channels of the signal processing system. That is the first and second coils form a first pair of coils and there are provided additional pairs arranged in an array. Preferably the pairs are arranged each relative to the next pair in the partly overlapping relationship known to provide conventional decoupling such that each pair has portions thereof outside portions of the other.

In another arrangement, the conductor connecting the first and second coils provides two conductors connecting the first and second coils one of which is a direct conducting connection and the other of which has a capacitor therein. This arrangement is preferably used where each coil of the pair is only partly overlapping with the other coil the first and second coils are rectangular so as to overlap at a common square. The arrangement of overlap is not of the proportions which provide the conventional decoupling.

In addition the receive coil arrangement itself is an aspect of the present invention and comprises:

first and second coils arranged to be located adjacent the subject so as to receive the MR signal;

the first and second coils being arranged in a stacked relationship so as to be at least partly overlapped;

said at said first and second coils including tuning capacitors arranged to provide individually tuning of the first and second coils to a common resonant frequency for receiving said MR signal at said common frequency;

each of said first and second coils having output connectors arranged to communicate the respective MR signals therein to a signal processing system;

the first and second coils being connected by a conductor having a capacitor therein arranged such that the signals of the first and second coils are decoupled.

Thus, instead of using a single layer for the elements as in the current design, the stacked phased array coil design will multiple layers for the individual elements without increasing the overall thickness of the finished coil.

The SNR values will be the $SNR=\sqrt{n} \times SNR_0$ for the stacked phased array coils value, where $SNR_0$ represents the SNR of a single layer design, where n is the number of layers. If n=2, the SNR will increase by 40%. If n=4, the SNR will be doubled.

This concept could be widely used in MR coils including:

MR Wireless coil either passive inductive wireless coil or active wireless coil as shown in the above U.S. application Ser. No. 13/090,816 filed Apr. 20, 2011 and 13/231,004 filed Sep. 13, 2011, the disclosure of which is incorporated herein by reference. This corresponds to Canadian application 2753561;

Current MR phased array coil designs with either wired or wireless communication;

Current Transmit receive coil designs;

Current multi-channel transmit receive coil;

Volume coils, such as Quadrature Butterfly, Phased Array Volume, and possibly Birdcage designs;

Radiolucent coil;

Internal coil, such as endorectal for prostrate, colon, or cervix examinations, cardiac catheter; and The coil construction can be used in the following applications: Head and neck, Upper body and Organs, Breast, Joints and Extremities.

The arrangement described herein can provide one or more of the following advantages and features:

The stacked phased array coil design can double the number of element without reducing the size of each element for better imaging penetration and increased SNR;

The stacked phase array design can be applied to any MRI coil design;

Tuning and matching the stacked phased array design does not require addition steps compared to the traditional phased array imaging coils; and The imaging quality can be improved with the same scan time, or the scan time can halved with the same imaging quality as traditional designs.

In an tested arrangement, 3T stacked inductive wireless coil imaging and single loop inductive wireless coil were tested, as in application Ser. No. 13/090,816, and the stacked coil produced a 35% increase in SNR compared to the single loop. Therefore, very good image quality and penetration were achieved.

BRIEF DESCRIPTION OF THE DRAWINGS

One embodiment of the invention will now be described in conjunction with the accompanying drawings in which.

In the drawings like characters of reference indicate corresponding parts in the different figures.

DETAILED DESCRIPTION

The apparatus shown in FIGS. 1 to 4 is taken from U.S. application Ser. No. 13/090,816 filed Apr. 20, 2011 and from 13/231,004 filed Sep. 13, 2011, the disclosures of which are incorporated herein by reference which corresponds to Canadian application 2753561 filed Sep. 12, 2011 and published Dec. 14, 2011.

This apparatus for MR imaging of a subject includes a conventional cylindrical MR magnet 10 operable by a field control system to generate a variable magnetic field to be applied to the subject.

The MR system includes an RF transmit arrangement 12 for generating RF pulses in a transmit stage to be applied to the subject to be imaged and a receive arrangement for acquiring the MR signal in a receive stage with a signal processing system 13 for receiving the MR signal for carrying out signal processing by which an image is generated. As is well known, the subject generates an MR signal in response to the magnetic field and the RF signal applied which is detected and processed to generate an image. The arrangement is well known and a suitable system is available from Siemens.

Typically the magnet 10 carries an RF coil known as a body coil 14 which is mounted on the cylindrical magnet housing so as to surround the patient. This is usually used as the transmit coil. However separate transmit can be used. The body coil can also operate as the receive coil. However again separate receive coils can be used. The transmit and receive coils can be the same coils or can be provided by separate coils.

Figure 1:
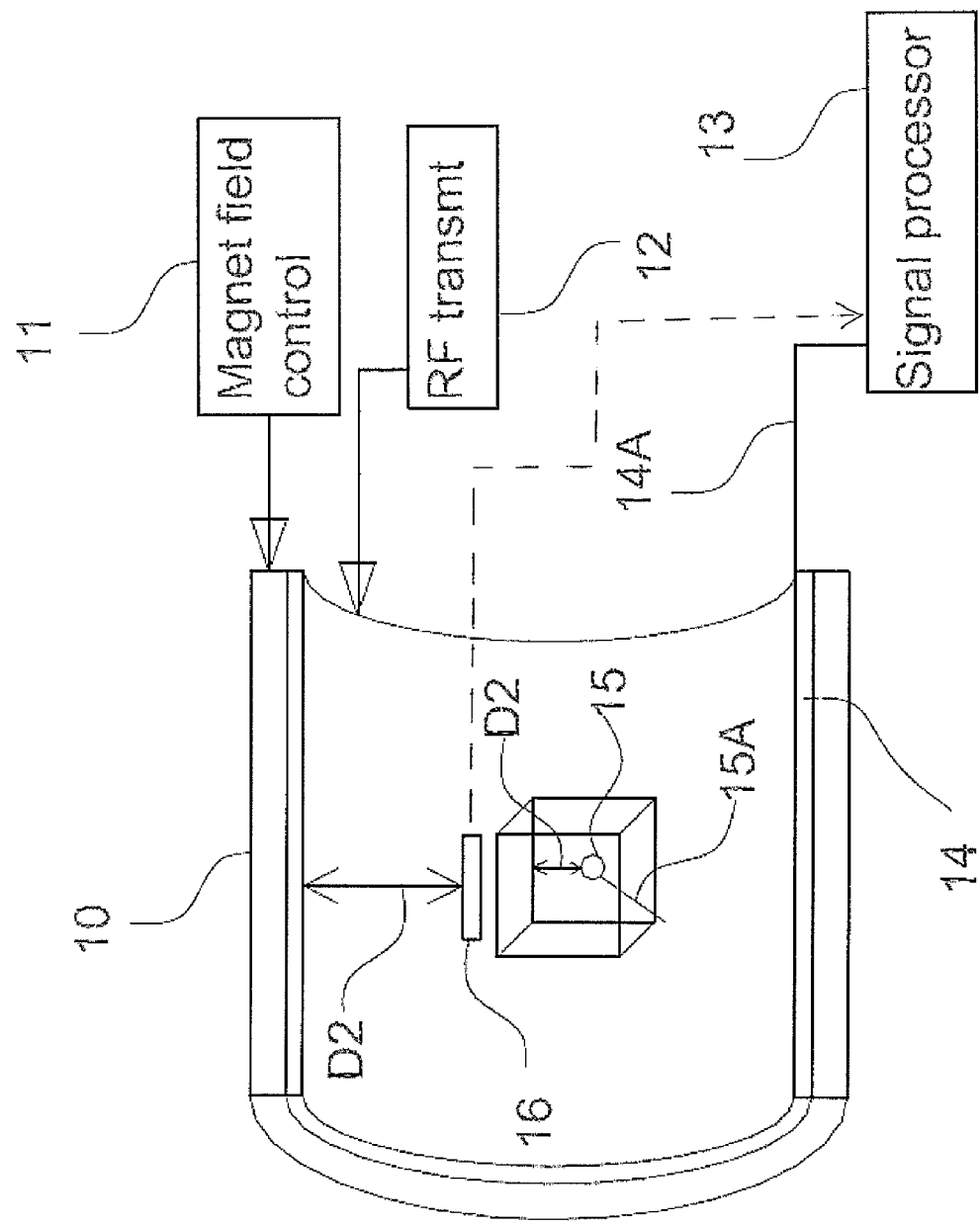
FIG. 1 is a schematic illustration of an MRI system including a first embodiment of the present invention.
Figure 2:
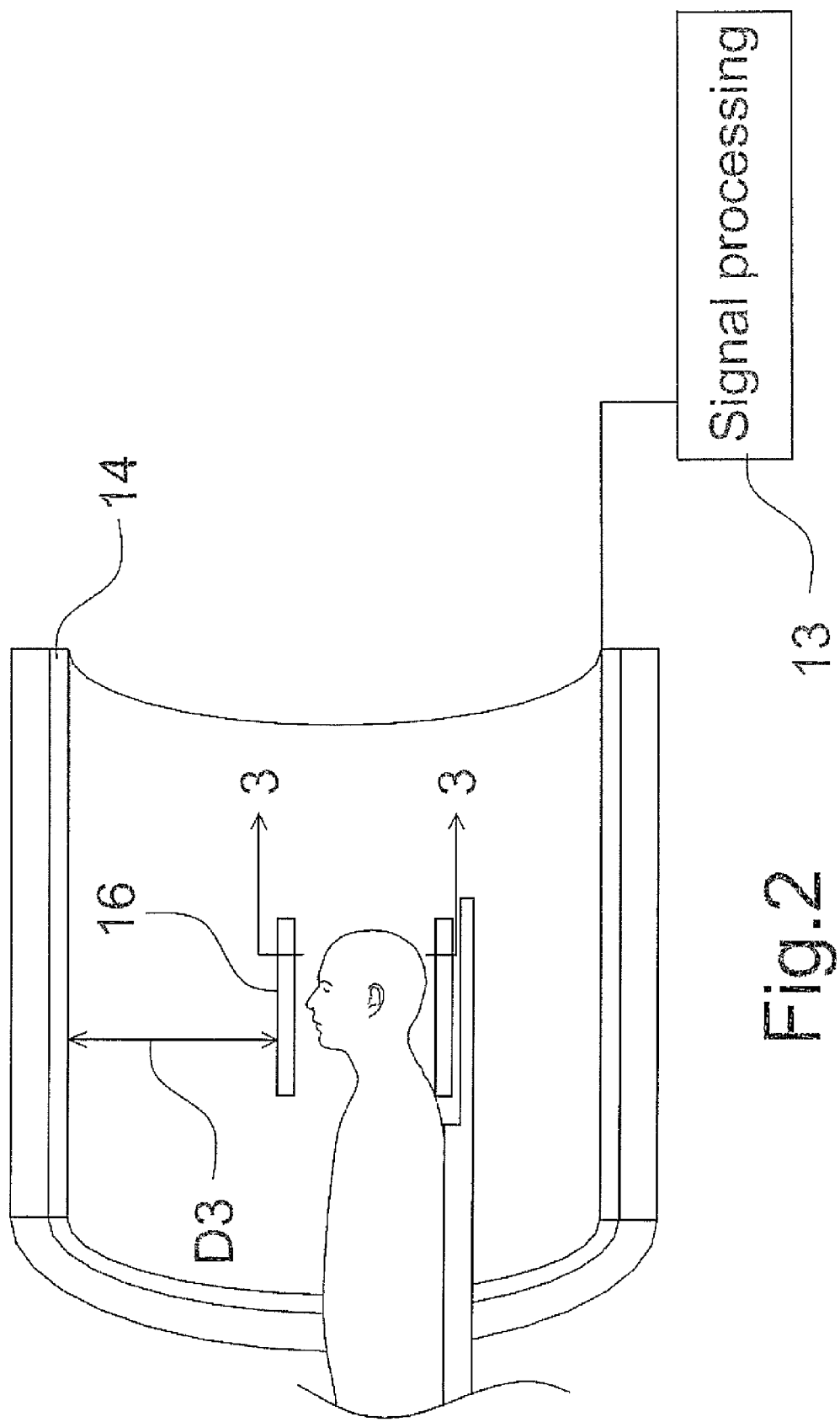
FIG. 2 is a schematic illustration of an MRI system including a second embodiment of the present invention.

In the first embodiment shown in FIG. 1, the transmit coil is defined by the body coil 14. The receive coil arrangement comprises an innermost coil loop 15 located inside the body of the patient. This is inserted by a suitable support 15A which moves the coil 15 to the required location within the patient, for example within the heart or other organ to be imaged. The receive coil arrangement further comprises a first outer coil 16 located adjacent to the innermost coil 15 but outside the body. The coil 16 can be formed by a single loop but more preferably by a phased array of loops. The receive coil arrangement further comprises a second outer coil defined by the body coil 14 surrounding the coil 16. In other arrangements a separate coil can be used for the second outer coil. In any case, the second outer coil has a signal communication cable 14A connected to the signal processing system 13 for transferring the MR signal therein to the signal processing system.

Figure 4:
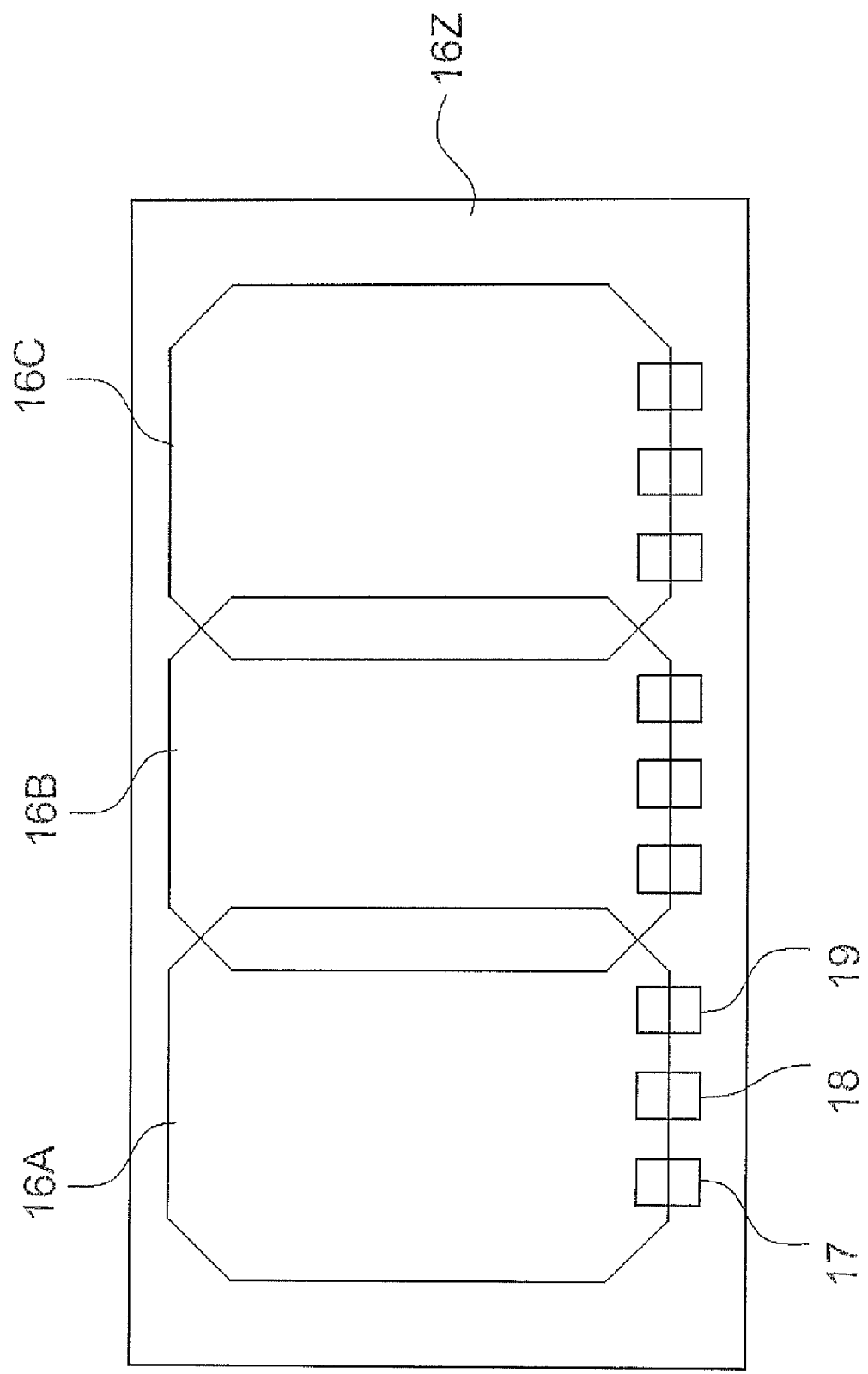
FIG. 4 is a schematic plan illustration of a top flexible portion of the head coil of FIG. 2.

In FIG. 4, a plan view is provided on the coil 16 which in this arrangement is formed by a phased array of loops 16A, 16B, 16C etc. All of the loops of the coils 15, 16 and 14 are individually tuned by a tuning component such as capacitors schematically indicated at 17 to a common resonant frequency for receiving said MR signal using conventional tuning devices well known to a person skilled in the art.

All of the coil loops of the coils 15 and 16 which act only in the receive stage and do not transmit the applied RF pulses in the transmit stage have therein an arrangement schematically indicated at 18, such as a passive block circuit with capacitors, inductor and pin diodes, to halt current flow therein during the transmit stage so as to prevent the presence of said all coil loops from interfering with the RF pulses during the transmit stage. Devices of this type are known so that explanation of the operation is not necessary.

In a conventional arrangement, the loop of the innermost coil 15 is arranged to communicate the MR signal therein to the signal processing system by a cable connection 14B.

In the arrangement of the above application, the loop of the innermost coil 15 is arranged to communicate the MR signal therein to the signal processing system through the loops of the first outer coil 16 and through the second outer coil 14 by inducing the MR signal onto the coil 15 and therefrom onto the coil 14.

Typically in this arrangement, the coil 16 is as close as possible to the exterior of the patient and this in turns communicates inductively to the body coil (or other coil) around the patient.

The intention in the above arrangement is that said the coils 15 and 16 are free from a wired cable carrying the MR signal to the signal processing system.

Typically in this arrangement, the coil 16 is as close as possible to the exterior of the patient and this in turns communicates inductively to the body coil (or other coil) around the patient.

Thus the coil 16 is arranged to be located as close as physically possible to the subject and the second coil or body coil 14 is located at a position spaced from the subject greater than the that of the coil 16 so as to receive the signal inductively and transfer it to the processing unit.

The coil 15 is as close as possible to the part to be imaged and covers or surrounds as small a volume as possible so as to receive noise from as small a volume as possible and so as to receive as much signal as possible, bearing in mind that the signal falls rapidly as is passes through the tissue. This therefore generates a signal which has significantly greater signal to noise ratio than a second coil located at a greater spacing from the part. Then the signal picked up by the coil 15 is communicated inductively to the coil 16 even though there are significant losses in the inductive communication. The signal from the coil 15 is induced onto the coil 16 at an efficiency of induction (less than 100%) but sufficient that that the MR signal on coil 16 is greater than the MR signal which would be generated on coil 16 in the absence of the coil 15. That is there is a magnifying effect by providing the coil 15 close to the subject and then communicating the signal to the coil 16 despite the losses in the inductive coupling. The same effect occurs at the second inductive stage between the coil 16 and the coil 14.

It will be appreciated that the coils 16 and 14 also receive signals directly from the part being imaged which signals are added to the signals communicated inductively. However in each case, the inductively coupled signal is much greater than the directly detected signal.

Another issue which arises is that mutual inductance between the coils 14, 16 and 15 can change the tuned common resonant frequency of the loops to reduce the MR signal unacceptably. Thus the spacing between them must be sufficient such that the amount of mutual inductance does not change the tuning frequency sufficiently to interfere with the tuning to a level where the acquisition of the signal is degraded. This is of course a trade off and the actual distance spacing between the particular coils of a specific embodiment must be determined by simple experimentation to move the coils to the required position to obtain the best signal having the best signal to noise ratio.

Figure 5:
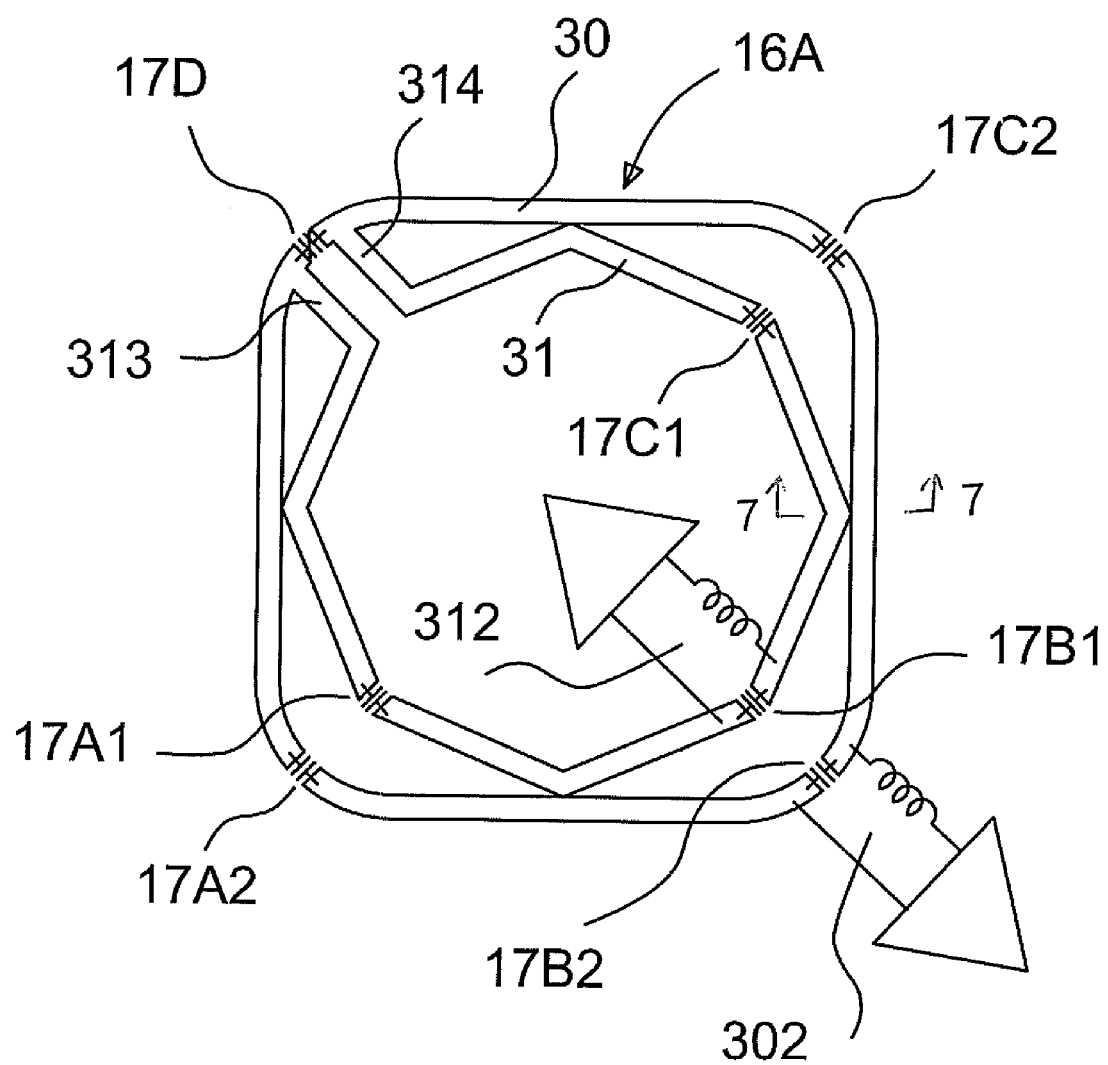
FIG. 5 is a top plan view of a first embodiment of stacked coil according to the present invention.

In the present arrangement, the receive coil arrangement of FIG. 4 is modified so that each coil element 16A, 16B etc, instead of being defined by a single coil loop is formed by a pair of coil elements 30 and 31 shown in FIG. 5. This includes first and second coils 30 and 31 which are as described above arranged to be located adjacent the subject so as to receive the MR signal.

Figure 7:
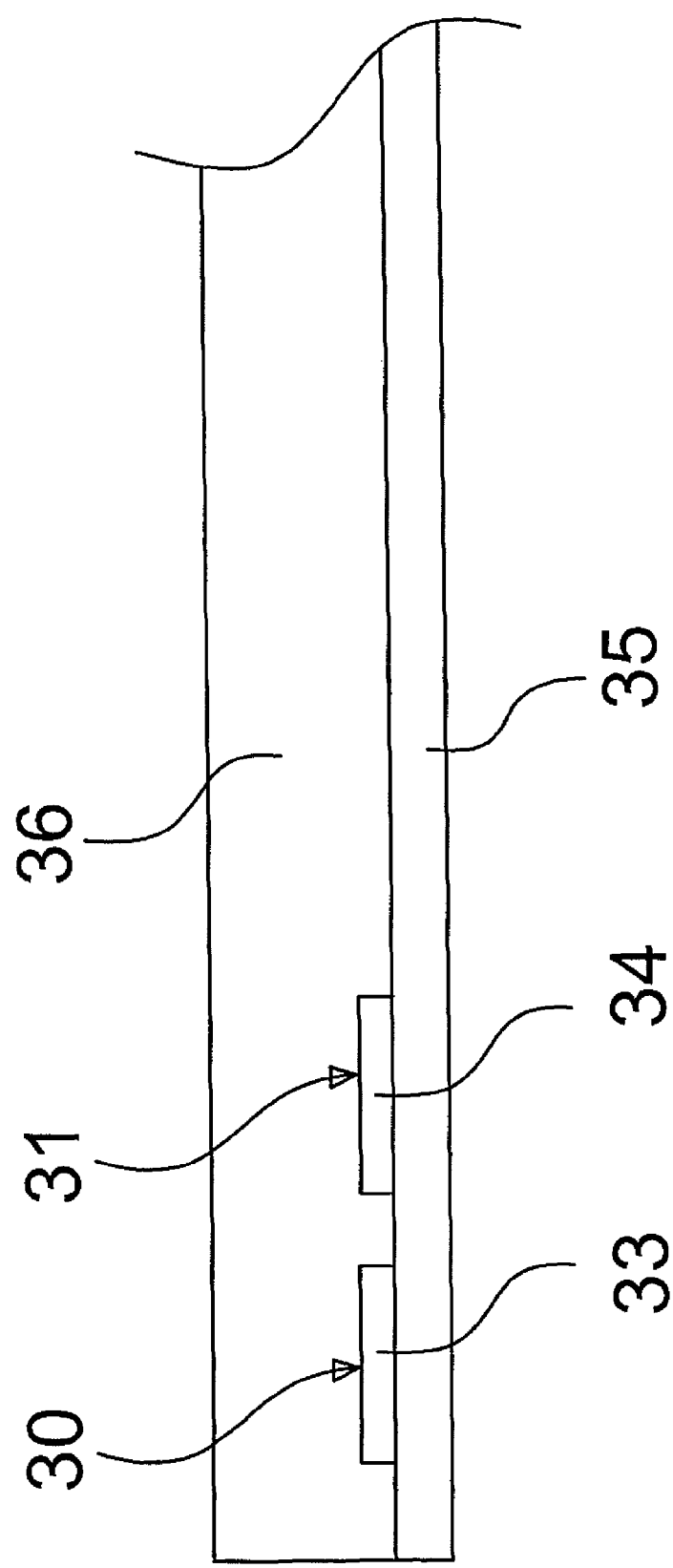
FIG. 7 is a cross-sectional view along the lines 7-7 of FIG. 5.

The first and second coils 30 and 31 are arranged in a stacked relationship so as to be at least partly overlapped. In this embodiment, the coils 30 and 31 are arranged to lie in a common plane as shown in FIG. 7; furthermore, the stacked coil elements 30 and 31 could also be partially overlapped. Thus the conductors 33 and 34 forming the coils are flat strip conductors of a conventional arrangement using a copper trace on an insulating support board 35. As is conventional the components 17, 18 and 19 necessary for the operation of the coil are also formed as traces or components mounted on the board 35. In particular the tuning capacitors 17 of the coil 31 are shown as separate capacitors 17A1, 17B1, 17C1 and 17D and the tuning capacitors 17 of the coil 30 are shown as separate capacitors 17A2, 17B2, 17C2 and 17D.

Thus it will be noted that a portion 301 of the coils is common to both coils 30 and 31 and contains a capacitor 17D which is therefore common to both.

The tuning capacitors of each coil are arranged using known techniques to provide individually tuning of the first and second coils to a common resonant frequency for receiving the MR signal at the common frequency.

Each of the coils is arranged to communicate the respective MR signals therein to the signal processing system 13 by separate connecting cable 302 and 312 such that the respective signals are processed in separate channels of the signal processing system. Further details of the coil and its capacitors and signal communication system are shown in U.S. application Ser. No. 12/546,148 filed Aug. 24, 2009 and published Feb. 24, 2011, the disclosure of which is incorporated herein by reference.

The values of the tuning capacitors and the capacitor 17D of the common portion of each of the first and second coils are selected to provide the required tuning to the required frequency and the decoupling of the mutual inductance so that the signals are decoupled and can be analyzed independently in separate channels of the processing system.

The values are selected using conventional techniques and practice can be obtained by empirical observations.

In one example, the coils have the following characteristics and the values of the capacitors are as follows:

In FIG. 5 as an example: the outer coil shape is squared with side length of 17 cm, the inner coil shape is octagonal with side length of 5.5 cm. Both coil elements are tuned at resonance frequency of 63.65 MHz. for Siemens 1.5T MR systems. A passive decoupling circuit is implemented to form a blocking circuit during transmit stage in this coil. The capacitor value are listed in following table.

| Capacitor number | | | | | | |
| --- | --- | --- | --- | --- | --- | --- |
| 17A1 | 17B1 | 17C1 | 17D | 17A2 | 17B2 | 17C2 |
| Value (pF) 27 | 20 + (4.5~20) | 27 | 4.5~20 | 15 | 12 + (4.5~20) | 15 |

Figure 3:
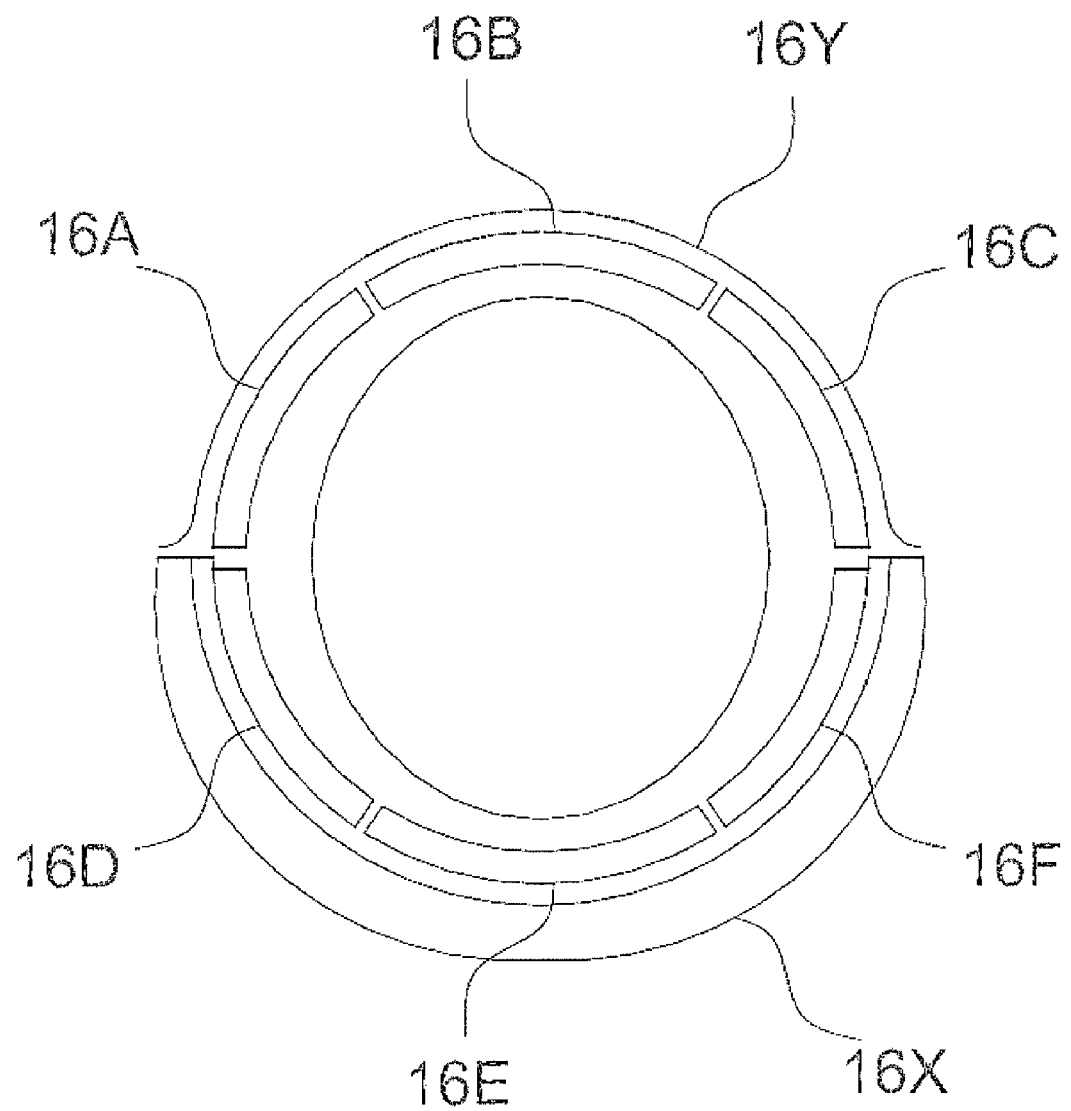
FIG. 3 is a schematic illustration of the head coil of FIG. 2 along the lines 3-3.

As shown in FIG. 7, the coils lie in a common surface and form surface coils contained in a common insulating material allowing the structure to be arched in shape to fit over the patient as shown in FIG. 3. In addition the surface coil assembly can be rigid or flexible. Furthermore, the wireless inductive coil version of the stacked coil can be sterilizable.

As shown in FIG. 5, the first and second coils are shaped to define substantially the same transverse dimensions for same depth penetration. Thus one of the coils 30 is generally square in plan with the capacitors at the corners. The other coil 31 is generally circular or octagonal and located wholly within the outer coil so that it approaches closely to the outer coil 30 only at four individual locations so as to reduce the capacitive coupling therebetween. Thus in FIG. 5 the first and second coils are arranged so that one lies wholly within or inside the other so that there are no crossing conducts and no portions where the inner coil lies outside the outer coil.

Thus the first and second coils are of different shape in plan so that the conductors thereof do not follow the same path.

This allows the coils to be formed of the conventional flat strip material while providing no locations where the conductors cross and minimizing the capacitive connection therebetween.

However the coils when measured in the transverse direction are substantially equal in width at the locations of closest approach and it is this dimension which governs the penetration depth of the imaging, as is known.

In order to provide the common portion 301, the inner coil 31 is connected to the outer coil by two legs 313 and 314 so that the common portion is located at the outer coil 30. It will be appreciated that the common portion 301 can be located at the inner coil 31.

Figure 8:
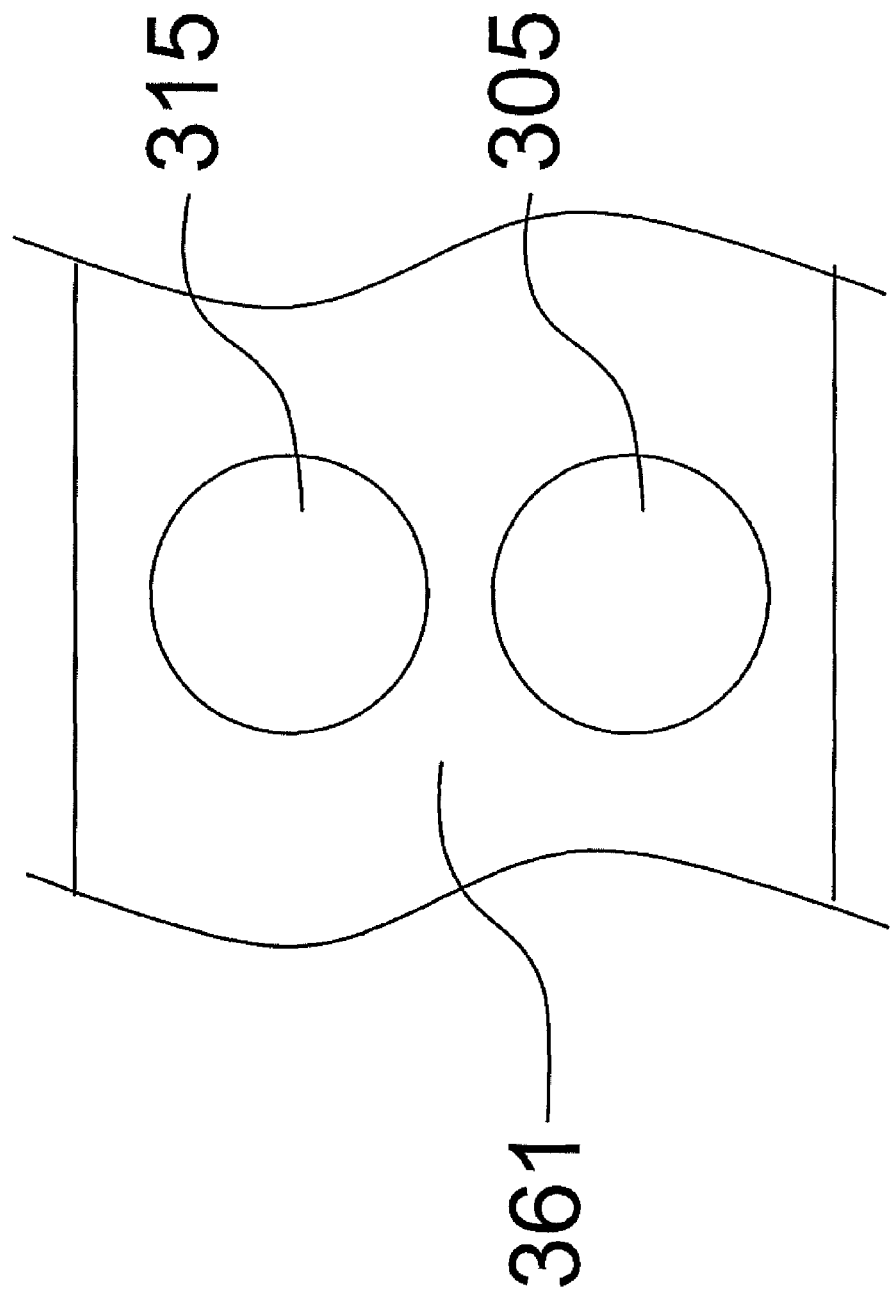
FIG. 8 is a cross-sectional view similar to that of FIG. 7 showing coils formed from wire.
Figure 9:
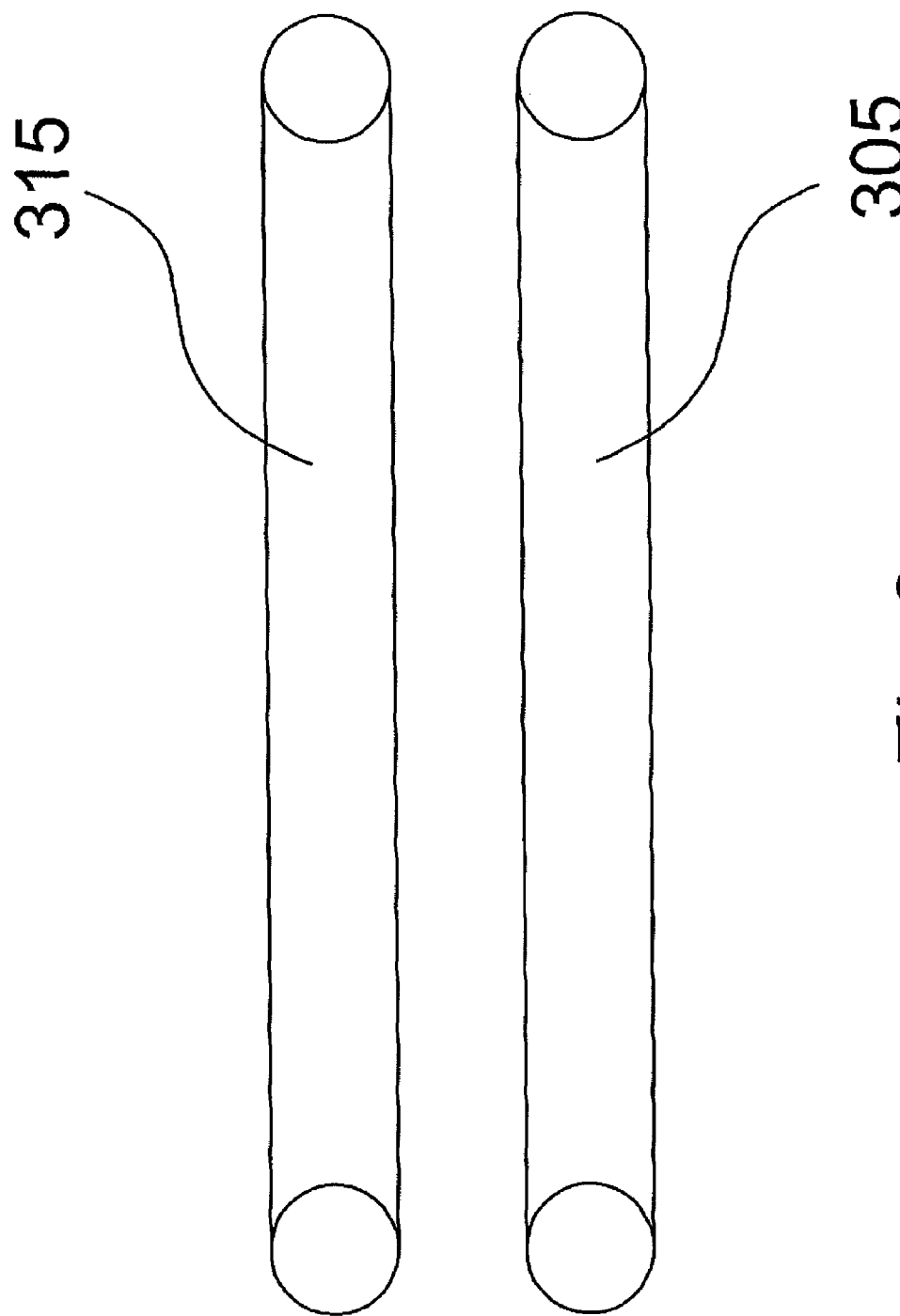
FIG. 9 is a cross-sectional view of the coils of FIG. 8 showing the coils formed from wire.

In the arrangement shown in FIGS. 8 and 9, the first and second coils 305 and 315 are each formed by conductors which are wire, that is they have a cross-section of the conductor which is circular or non-rectangular so as to reduce the capacitive coupling therebetween. This allows the conductors to be directly overlying with an insulating material 361 therebetween. As shown in FIG. 8, the curvature of the surfaces of the conductors reduces the capacitive connection.

Figure 10:
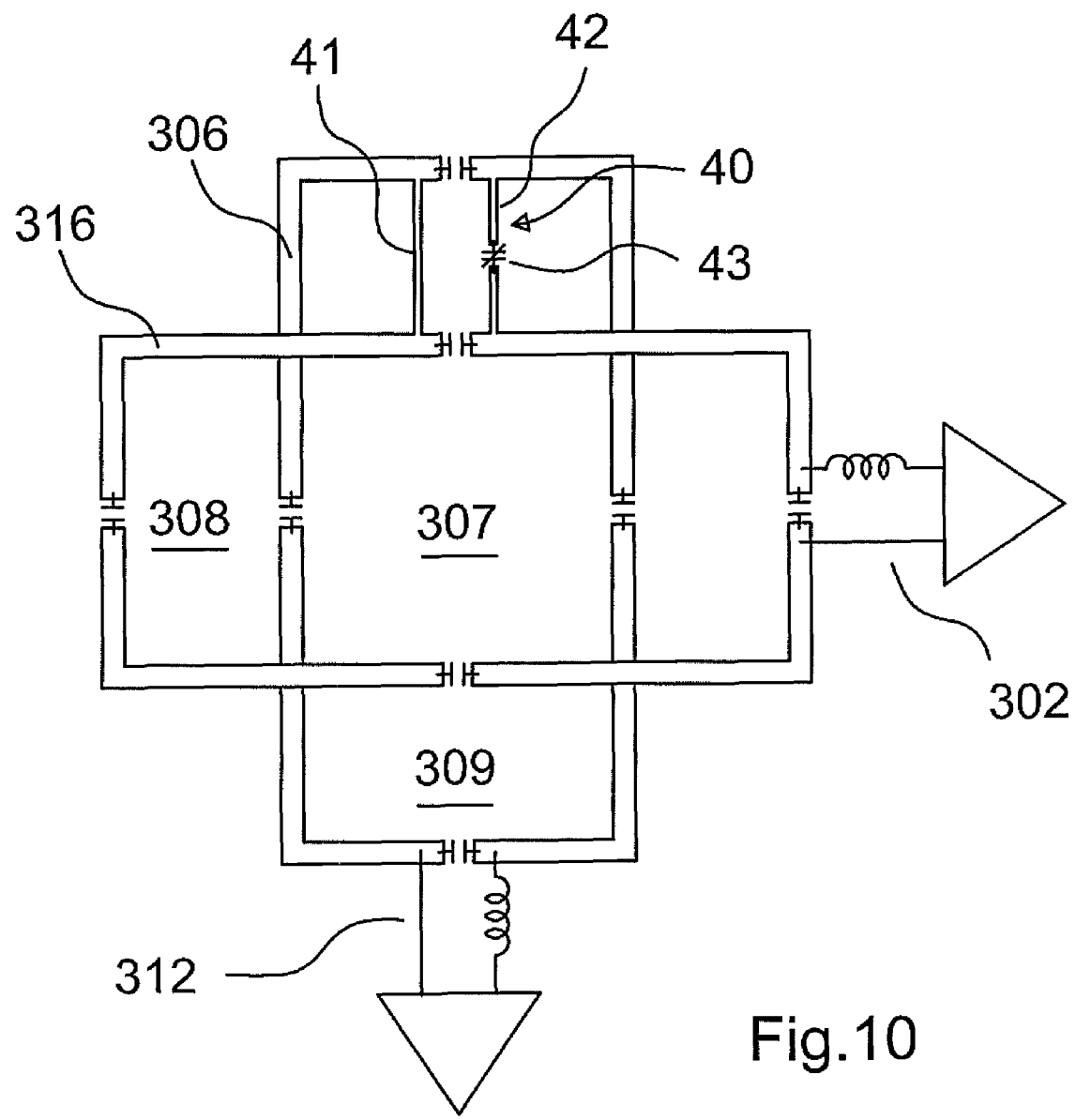
FIG. 10 is a top plan view of a third embodiment of stacked coil according to the present invention.

As shown in FIG. 10, an alternative embodiment is provided in which the coils 306 and 316 are only partially overlapping defining a central square overlapped section 307 and two non-overlapping sections 308 and 309. In this case again the mutual inductance is decoupled by the conductor arrangement 40 connecting the first and second coils 306, 316 provides two conductors 41 and 42 connecting the first and second coils one of which is a short and the other of which has a capacitor 43 therein.

Figure 6:
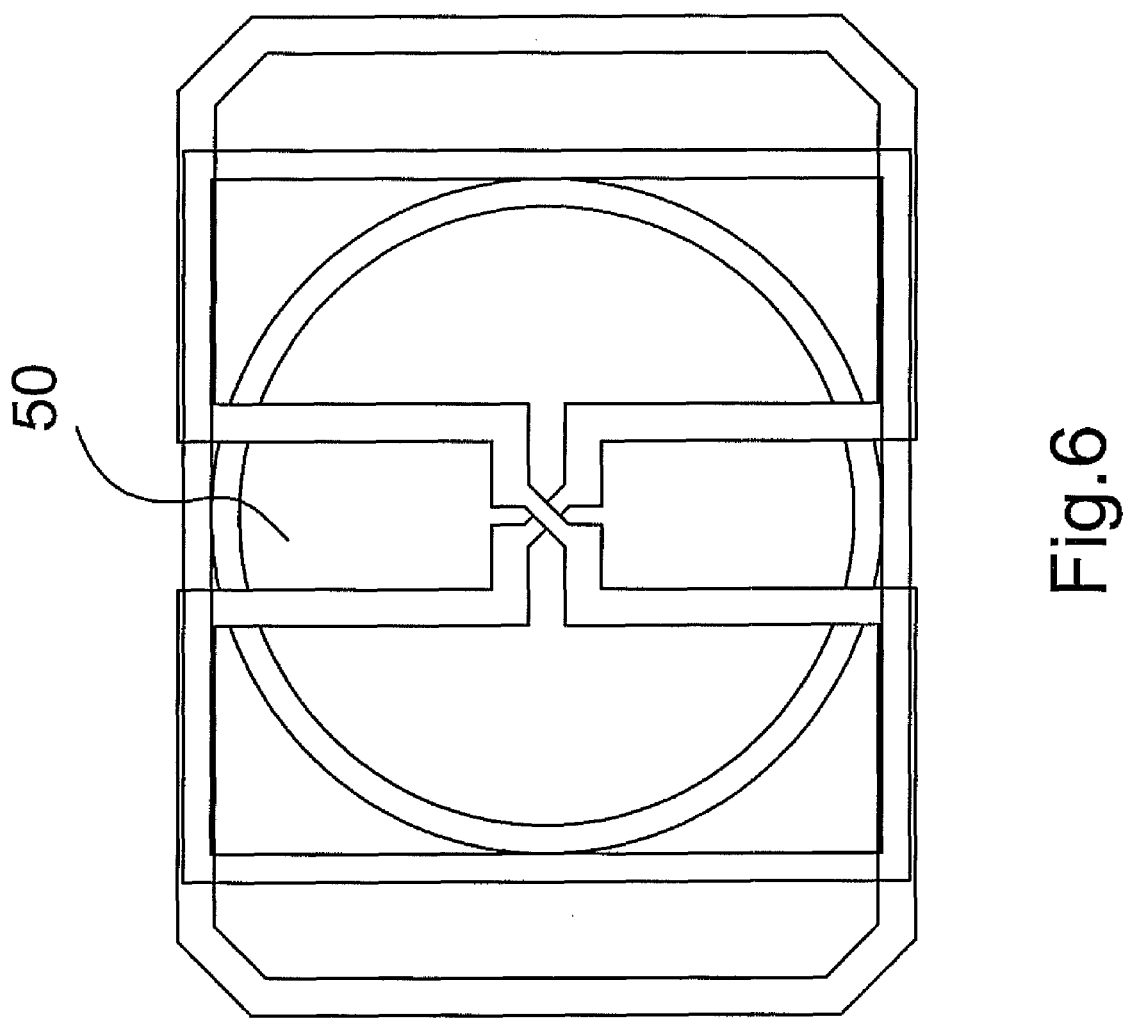
FIG. 6 is a top plan view of a second embodiment of stacked coil according to the present invention.

As previously explained the first and second coils form a first pair of coils and wherein there are provided additional pairs arranged in an array or partly overlapping pairs where each pair provides two respective signals for a respective pair of channels of the signal processing system. This can provide separate channels for the MRI system, including the signal processing system which can be two channels up to the limits of the system. By using a signal hardware combiner, the number of the coil elements can be further increased. In addition the paired coils can be formed of three or more overlying coil elements so as to provide further additional channels. In addition the paired coils can be combined with the known construction of a butterfly coil which could be a single layer or a stacked element coil 50 shown in FIG. 6 which is known by its construction to decouple from a single loop surface coil.

The two layer inductive stacked phased array coil design was developed as a proof of concept. The following table described the measured SNR test result on a 1900 ml bottle phantom in a 3T MR imaging system. The ratio is SNR of the stacked coil divided by the SNR of the single coil.

| Coil | Signal (M) | Noise (SD) | SNR | Ratio |
| --- | --- | --- | --- | --- |
| Single | 806.4 | 5.0 | 161.3 | N/A |
| Stacked | 955.1 | 4.4 | 217 | 1.35 |

The invention claimed is:

1. Apparatus for MR imaging of a subject comprising
a MR magnet to generate a magnetic field to be applied to the subject;
an RF transmit coil arrangement for generating an RF pulse in a transmit stage to be applied to the subject to be imaged such that the subject generates an MR signal in response to the magnetic field and the RF pulse applied;
a receive coil arrangement for acquiring MR signals in a receive stage;
and a signal processing system having a plurality of separate channels for receiving the MR signals for carrying out signal processing in the separate channels by which an image is generated;
the receive coil arrangement comprising:
first and second coils arranged to be located adjacent the subject so as to receive the MR signal;
the first and second coils being arranged in a stacked relationship so as to be at least partly overlapped;
said at said first and second coils each including a plurality of tuning capacitors arranged to provide individually tuning of the first and second coils to a common resonant frequency for receiving said MR signal at said common frequency;
each of said first and second coils being arranged to communicate the respective MR signals therein to the signal processing system such that the respective signals are processed in separate channels of the signal processing system;
the first and second coils being connected by at least one conductor arranged such that the signals of the first and second coils are decoupled;
at least one receive coil;
said at least one receive coil having at least one signal communication cable connected to the signal processing system for transferring the MR signal therein to the signal processing system;
said at least one receive coil and said first and second coils being individually tuned to a common resonant frequency for receiving said MR signal;
all coil loops of said first and second coils and said at least one receive coil which act only in the receive stage and do not transmit the applied RF pulse in the transmit stage having therein an arrangement to halt current flow therein at the resonant frequency during the transmit stage so as to prevent the presence of said all coil loops from interfering with the RF pulse during the transmit stage;
said first and second coils being arranged to communicate the MR signal therein to the signal processing system through said at least one receive coil by inducing the MR signal onto said at least one receive coil;
wherein said at least one receive coil is located at a spacing from said first and second coils such that:
the signal from said first and second coils is induced onto said at least one receive coil at an efficiency of induction sufficient that that the MR signal on said at least one receive coil is greater than the MR signal which would be generated in the absence of said first and second coils; and
mutual inductance between said first and second coils and said at least one receive coil is insufficient to change the tuned common resonant frequency of the first and second coils and the receive coil sufficiently to reduce the MR signal at said at least one receive coil to a value which is less than the MR signal which would be generated in the absence of said first and second coils.

2. The apparatus according to claim 1 wherein the first and second coils are decoupled by cancelling mutual inductance therebetween.

3. The apparatus according to claim 1 wherein the first and second coils comprise surface coils.

4. The apparatus according to claim 1 wherein the first and second coils lie substantially in a common surface.

5. The apparatus according to claim 1 wherein the common surface is in a common plane.

6. The apparatus according to claim 1 wherein the first and second coils are shaped to define substantially the same transverse dimensions for same depth penetration.

7. The apparatus according to claim 1 wherein the first and second coils are arranged so that one lies inside the other.

8. The apparatus according to claim 7 wherein the first and second coils are of different shape in plan so that the conductors thereof do not follow the same path.

9. The apparatus according to claim 1 wherein the first and second coils are each formed by conductors which are wire.

10. The apparatus according to claim 9 wherein the wire conductors of the first and second coils are stacked so as to be directly overlying.

11. The apparatus according to claim 1 wherein the conductor connecting the first and second coils provides a common portion of each of the first and second coils including a capacitance of in the common portion which forms part of the tuning capacitors of each of the first and second coils and is arranged to provide the decoupling.

12. The apparatus according to claim 1 wherein the first and second coils form a first pair of coils and wherein there are provided additional stacked coil pairs arranged in an array, or partly overlapping pairs where each pair provides two respective signals for a respective pair of channels of the signal processing system.

13. The apparatus according to claim 1 wherein the first and second coils are arranged to be partly overlapping such that each has portions thereof outside portions of the other.

14. The apparatus according to claim 13 wherein the first and second coils are rectangular so as to overlap at a common square.

15. The apparatus according to claim 1 wherein said at least one conductor connecting the first and second coils comprises first and second conductors connecting the first and second coils;
   the first and second conductors being un-connected each to the other;
   the first and second conductors being separated at the first coil by a respective one of said plurality of tuning capacitors of the first coil and the first and second conductors being separated at the second coil by a respective one of said plurality of tuning capacitors of said second coil;
   said first and second tuning capacitors being arranged such that none is in either of the first and second conductors;
   at least the first conductor having a de-coupling capacitor therein arranged such that the signals of the first and second coils are decoupled.

16. A receive coil arrangement for use in MR imaging of a subject comprising
   first and second coils arranged to be located adjacent the subject so as to receive the MR signal;
   the first and second coils being arranged in a stacked relationship so as to be at least partly overlapped;
   said first coil including in the first coil a plurality of first tuning capacitors and said second coil including in the second coil a plurality of second tuning capacitors with said first and second tuning capacitors arranged to provide individually tuning of the first and second coils to a common resonant frequency for receiving said MR signal at said common frequency;
   each of said first and second coils being arranged to communicate the respective MR signals therein to a signal processing system;
   the first and second coils being connected by a first and by a second conductor;
   the first and second conductors being un-connected each to the other;
   the first and second conductors being separated at the first coil by a respective one of said plurality of tuning capacitors of the first coil and the first and second conductors being separated at the second coil by a respective one of said plurality of tuning capacitors of said second coil;
   said first and second tuning capacitors being arranged such that none is in either of the first and second conductors;
   at least the first conductor having a de-coupling capacitor therein arranged such that the signals of the first and second coils are decoupled.

17. The apparatus according to claim 16 wherein the first and second coils are shaped to define substantially the same transverse dimensions for same depth penetration.

18. The apparatus according to claim 16 wherein the first and second coils are arranged so that one lies inside the other.

19. The apparatus according to claim 16 wherein the first and second coils are of different shape in plan so that the conductors thereof do not follow the same path.

20. The apparatus according to claim 16 wherein the first and second coils are each formed by conductors which are wire wherein the wire conductors of the first and second coils are stacked so as to be directly overlying.

* * * * *